(12) United States Patent
Daikoku et al.

(10) Patent No.: US 6,890,799 B2
(45) Date of Patent: May 10, 2005

(54) DEVICE FOR SEALING AND COOLING MULTI-CHIP MODULES

(75) Inventors: Takahiro Daikoku, Ushiku (JP); Kenichi Kasai, Ushiku (JP); Toshitada Netsu, Hadano (JP); Koichi Koyano, Hadano (JP); Takayuki Uda, Hadano (JP)

(73) Assignee: Hitachi, Ltd., Tokyo (JP)

( * ) Notice: Subject to any disclaimer, the term of this patent is extended or adjusted under 35 U.S.C. 154(b) by 99 days.

(21) Appl. No.: 10/338,485

(22) Filed: Jan. 7, 2003

(65) Prior Publication Data

US 2003/0103333 A1 Jun. 5, 2003

Related U.S. Application Data

(62) Division of application No. 09/631,889, filed on Aug. 4, 2000, now Pat. No. 6,528,878.

(30) Foreign Application Priority Data

Aug. 5, 1999 (JP) .............................................. 11-222058

(51) Int. Cl.$^7$ ......................... H01L 21/48; H01L 23/34; H05K 7/20

(52) U.S. Cl. ...................... 438/122; 257/707; 257/714; 257/718; 361/689; 361/702; 361/710

(58) Field of Search .................................. 257/706, 707, 257/712, 713, 714, 718, 720, 722, 678, 704, 717, 723, 724, 730; 438/106, 121, 122; 361/679, 688, 689, 704, 702, 703, 709–711, 718, 719

(56) References Cited

U.S. PATENT DOCUMENTS

| | | | | |
|---|---|---|---|---|
| 4,138,692 A | * | 2/1979 | Meeker et al. | 257/697 |
| 4,381,032 A | * | 4/1983 | Cutchaw | 165/46 |
| 4,612,978 A | * | 9/1986 | Cutchaw | 165/104.33 |
| 4,628,990 A | * | 12/1986 | Hagihara et al. | 165/80.4 |
| 4,685,211 A | * | 8/1987 | Hagihara et al. | 29/832 |
| 4,879,629 A | * | 11/1989 | Tustaniwskyj et al. | 361/699 |
| 5,109,317 A | * | 4/1992 | Miyamoto et al. | 361/715 |
| 5,126,829 A | * | 6/1992 | Daikoku et al. | 257/713 |
| 5,323,292 A | * | 6/1994 | Brzezinski | 361/689 |
| 5,345,107 A | * | 9/1994 | Daikoku et al. | 257/717 |
| 5,349,831 A | * | 9/1994 | Daikoku et al. | 62/376 |
| 5,528,462 A | * | 6/1996 | Pendse | 361/767 |
| 5,705,850 A | * | 1/1998 | Ashiwake et al. | 257/714 |
| 5,751,062 A | * | 5/1998 | Daikoku et al. | 257/722 |
| 5,774,334 A | * | 6/1998 | Kawamura et al. | 361/699 |
| 5,982,038 A | * | 11/1999 | Toy et al. | 257/772 |
| 6,037,658 A | * | 3/2000 | Brodsky et al. | 257/707 |
| 6,528,878 B1 | * | 3/2003 | Daikoku et al. | 257/714 |

FOREIGN PATENT DOCUMENTS

| | | | | | |
|---|---|---|---|---|---|
| JP | 58218148 A | * | 12/1983 | | H01L/23/34 |
| JP | 60126852 A | * | 7/1985 | | H01L/23/36 |
| JP | 60143653 A | * | 7/1985 | | H01L/23/46 |
| JP | 63169053 A | * | 7/1988 | | H01L/23/46 |

* cited by examiner

Primary Examiner—Alonzo Chambliss
(74) Attorney, Agent, or Firm—Townsend and Townsend and Crew LLP

(57) ABSTRACT

According to the invention, a sealing top plate in a multi-chip module is formed from a ceramic with high thermal conductivity having a thermal expansion coefficient consistent with that of a multi-layer circuit substrate. A cooling flow path cover covering the entirety of cooling flow path grooves is formed as a separate metallic member. The back surface of the sealing top plate, on which are formed the cooling flow path grooves, is bonded directly to the back surface of a semiconductor device using solder. A thermal-conductive jacket with low thermal resistance is provided. A multi-chip module sealing frame is soldered to the edge of the sealing top plate. Furthermore, a sealing material such as an O-ring is simply interposed between the edge of the sealing top plate and the cooling water path cover, and tightening means is used to tighten the metallic cooling flow path cover and the multi-chip module sealing frame to each other.

10 Claims, 3 Drawing Sheets

DEVICE FOR SEALING AND COOLING MULTI-CHIP MODULES

CROSS-REFERENCES TO RELATED APPLICATIONS

This application claims priority from Japanese Patent Application Reference No. 11-222058, filed Aug. 5, 1999, and is a continuation of application Ser. No. 09/631,889, filed Aug. 4, 2000, now U.S. Pat. No. 6,528,878.

BACKGROUND OF THE INVENTION

The present invention relates generally to integrated circuit chips with semiconductor elements, and more specifically for large scale integrated circuit chips with semiconductor elements that provide high speeds, high integration, high heat-generation density, high power dissipation, and large dimensions for use in large-scale computers or supercomputers.

In computers, such as large-scale computers and supercomputers, increased processing throughput and storage capacity is achieved by higher speeds, greater integration, larger dimensions, and higher thermal density in large-scale integrated circuits with semiconductor elements (hereinafter abbreviated as LSIs). Also, in order to transfer signals at high-speeds between multiple LSIs, the electrical connections between the multiple LSIs must be made as short as possible. This need is met with multi-chip modules in which multiple LSIs are densely mounted on a multi-layer circuit substrate. Thus, providing a cooling mechanism to assure stable operations of the LSIs, and providing a tight sealing mechanism to reliably protect the LSIs from the outside environment are important technical issues for multi-chip modules.

What is needed are better techniques for sealing and cooling multi-chip modules.

SUMMARY OF THE INVENTION

According to the present invention, techniques for sealing and cooling multi-chip modules equipped with a cooling mechanism are provided. Embodiments according to the invention can provide a reliable, tight seal for multi-chip modules with a high-density arrangement of multiple integrated circuit chips with semiconductor elements. Techniques according to the invention can eliminate, with a low thermal resistance, the heat generated by multiple integrated circuit chips with semiconductor elements. Embodiments according to the present invention can be especially useful when applied to integrated circuit chips with semiconductor elements, and more specifically for integrated circuit chips with semiconductor elements that provide high speeds, high integration, high heat-generation density, high power dissipation, and large dimensions for use in large-scale computers or supercomputers.

In a representative embodiment according to the present invention, there is provided a multi-chip module sealing/cooling device equipped with a multi-chip module cooling mechanism that uniformly and efficiently lowers the temperature of LSIs formed with high integration, high heat-generating density, large dimensions, high power dissipation, and dense mounting.

Further, in another representative embodiment according to the present invention, there is provided a multi-chip module sealing/cooling device equipped with a multi-chip module sealing mechanism that is easy to assemble and disassemble and that provides long-term, reliable protection for the LSIs, for example.

In a representative embodiment according to the present invention, there is provided a multi-chip module sealing/cooling device in which a sealing top plate of a multi-chip module, on which is formed cooling flow path grooves, that is directly soldered to the LSI chips or a back surface of a semiconductor device such as an LSI package containing an LSI chip.

Embodiments according to the present invention can also provide a multi-chip module sealing/cooling device in which a lowered offset is formed at the edge of the back surface of the LSI package containing the LSI chip. In a specific embodiment, this offset can be approximately 500 micrometers, measured from the back surface of the device, for example. Other embodiments can have other size offsets as well. This controls the area used for the solder bond formed on the sealing top plate of the multi-chip module, on which is formed a cooling flow path groove.

Embodiments according to the present invention can also provide a multi-chip module sealing/cooling device in which the sealing top plate of the multi-chip module, on which is formed a cooling flow path groove, is formed from a ceramic having a high thermal conductivity having a thermal expansion coefficient consistent with that of the multi-layer circuit substrate. A cooling flow path cover covering the entire area of the cooling flow path groove is formed as a separate member. Thus, the thermal capacity of the sealing top plate is reduced for when a solder bond is formed with the back surface of the semiconductor device such as an LSI chip or an LSI package containing an LSI chip.

Embodiments according to the present invention can also provide a multi-chip module sealing/cooling device in which the sealing top plate, on which a cooling flow path groove is formed, is formed from a ceramic having a high thermal conductivity. A cooling flow path cover covering the entire area of the cooling flow path groove is formed from a metallic material. A tightening means interposes a sealing material such as an O-ring between the edge of the sealing top plate and the cooling flow path cover and tightens together the metallic cooling flow path cover and a sealing frame of the multi-chip module. This maintains the strength of the ceramic sealing top plate while preventing leakage of the cooling fluid and also increasing the strength of pipe connections that allow cooling fluid to flow in and out of the cooler.

In a representative embodiment according to the present invention, a device for sealing and cooling multi-chip modules is provided. The multi-chip modules can comprise a circuit substrate having a plurality of semiconductor devices mounted thereon, and a frame. The frame fixed to the circuit substrate and formed from a material having a thermal expansion coefficient consistent with a thermal expansion coefficient of the circuit substrate. The device can comprise a sealing top plate, a first surface thereof being formed with a cooling flow path, a second surface thereof being bonded to a back surface of the semiconductor devices, and an edge thereof, joining the frame to form a first seal. The sealing top plate can be formed from a ceramic having a high thermal conductivity and a thermal expansion coefficient consistent with that of the multi-layer circuit substrate, for example. The back surface of the sealing top plate can be bonded directly to the back surface of the semiconductor devices using solder, for example, in order to provide a thermal conductive path having a low thermal resistance. A cooling flow path cover for covering the cooling flow path can also be provided. The cooling flow path cover can be metallic, or the like. A sealing material for preventing leakage of a cooling fluid from the cooling flow path can be provided.

The sealing material interposed between the edge of the sealing top plate and the cooling flow path cover to form a second seal. The sealing material can be an o-ring, and the like, for example. A tightening means, such as a plurality of bolts, for example, can be used to tighten together the cooling flow path cover, the sealing material, the sealing top plate and the frame. An area formed by the top surface of the circuit substrate, the bottom surface of the sealing top plate and the first seal can be filled with nitrogen gas, for example.

In another representative embodiment according to the present invention, a method for sealing multi-chip modules is provided. The method is useful with multi-chip modules comprising a circuit substrate having a plurality of semiconductor devices mounted thereon, and a frame, for example. The frame can be fixed to the circuit substrate and formed from a material having a thermal expansion coefficient consistent with a thermal expansion coefficient of the circuit substrate. The method comprises forming onto a first surface of a sealing top plate a cooling flow path. Bonding a second surface of the sealing plate to a back surface of the semiconductor devices can also be part of the method. Further, the method can include joining an edge of the sealing plate to the frame to form a first seal. Covering the cooling flow path with a cooling flow path cover and interposing a sealing material between the edge of the sealing top plate and the cooling flow path cover to form a second seal can also be part of the method. Further, the method can include tightening together the cooling flow path cover, the sealing material, the sealing top plate and the frame.

Numerous benefits are achieved by way of the present invention over conventional techniques. The present invention can provide in select embodiments, a multi-chip module sealing/cooling device equipped with a multi-chip module cooling mechanism that can uniformly and efficiently lower the temperature of an LSI with high integration, high thermal generation density, large dimensions, high power consumption, and dense mounting. Also, embodiments according to the present invention can provide a multi-chip module sealing/cooling device equipped with a multi-chip module sealing module protecting the LSI described above with long-term reliability and with easy assembly and disassembly.

These and other benefits are described throughout the present specification. A further understanding of the nature and advantages of the invention herein may be realized by reference to the remaining portions of the specification and the attached drawings.

DESCRIPTION OF THE SPECIFIC EMBODIMENTS

The present invention provides techniques for sealing and cooling multi-chip modules equipped with a cooling mechanism. Embodiments according to the invention can provide a reliable, tight seal for multi-chip modules with a high-density arrangement of multiple integrated circuit chips with semiconductor elements. Embodiments according to the present invention can be especially useful when applied to integrated circuit chips with semiconductor elements, and more specifically for integrated circuit chips with large-scale integrated circuits with semiconductor elements (hereinafter abbreviated as LSIs) that provide high speeds, high integration, high heat-generation density, high power consumption, and large dimensions for use in large-scale computers or supercomputers. In order to transfer signals at high-speeds between multiple LSIs, the electrical connections between the multiple LSIs must be made as short as possible. This need is met with multi-chip modules in which multiple LSIs are densely mounted on a multi-layer circuit substrate. Thus, providing a cooling mechanism to assure stable operations of the LSIs and providing a tight sealing mechanism to reliably protect the LSIs from the outside environment are important technical issues for multi-chip modules.

Figure 5:
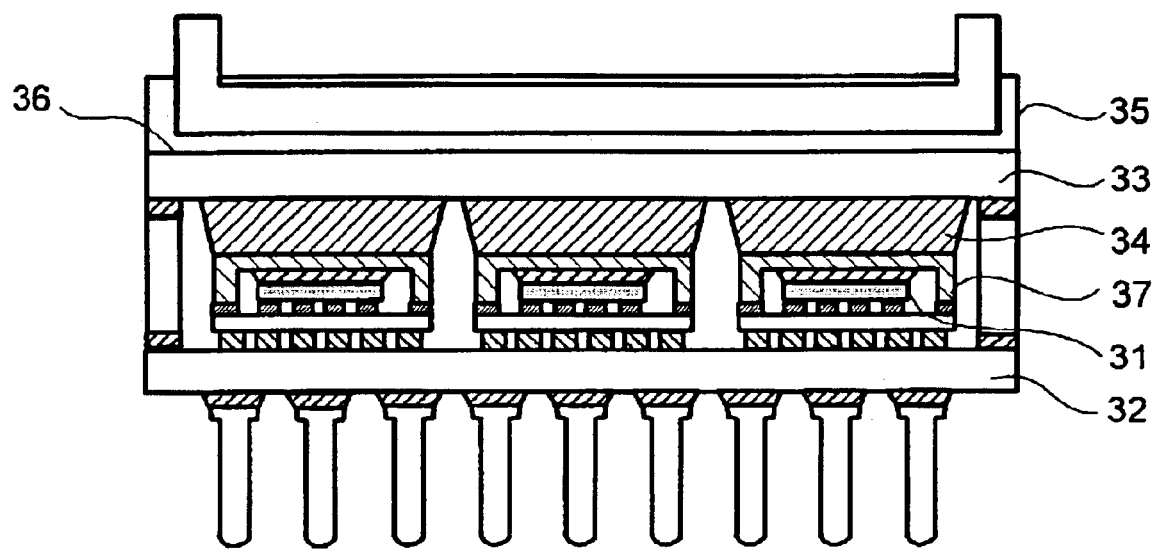
FIG. 5 illustrates a cross-section drawing showing a multi-chip module sealing/cooling device according to a conventional technology.

One type of sealing/cooling device for multi-chip modules is presented in Japanese laid-open patent publication number Hei 3-283451, and in a corresponding U.S. Pat. No. 5,276,289, shown in FIG. 5. In this example, multiple package-type semiconductor devices 37 containing LSI chips 31 are mounted on a multi-layer circuit substrate 32. A sealing top plate 33 serving as a sealing cap for the multi-chip module is fixed with a die bond 34 formed from a solder. An integrally formed cooling water path 35, within which flows cooling water, is mounted above the sealing top plate 33, separated from the sealing top plate 33 by a thermal-conductive grease 36.

Furthermore, in a sealing/cooling device for multi-chip modules presented in Japanese laid-open patent publication number 2-257664, and in a corresponding U.S. Pat. No. 5,325,265, multiple LSI chips are mounted on a multi-layer circuit substrate. The back sides of the LSI chips are soldered to the back side of an integrally formed water-cooled heat sink equipped with an internal cooling flow path, thus providing a thermal conduction path with low thermal resistance. Cooling water flowing through the heat sink eliminates heat generated by the LSI chips. This water-cooled heat sink serves as the sealing cap for the multi-chip module.

With the growing demand for faster processing speeds in computer such as large-scale computers and supercomputers, the LSIs used in these must have high integration, high heat-generation density, large dimensions, high power dissipation, and dense mounting. For example, LSI chip size can be 15–150 W/cm$^2$.

In multi-chip modules, where multiple LSI chips with this type of high heat-generation density, large dimensions, and high power dissipation are mounted, the following problems can arise, which were not so significant for conventional LSI chips with LSI chip sizes on the order of approximately 10 mm squared and LSI chip heat-generating densities on the order of approximately 10–50 W/cm$^2$.

The first issue is that since the heat-generating density and heat values are very large, a small change in cooling conditions can greatly affect the temperature of the LSI chip. Thus, compared to the conventional technology, maintaining roughly the same temperature becomes more difficult.

To maintain quality in computers, a sealing/cooling mechanism that is relatively unaffected by variations that occur in productions is needed. Furthermore, in multi-chip modules, the uniformity of the electrical properties of the multiple LSI chips is important. Thus, it is important to always keep the temperatures of the multiple LSIs stable and roughly the same.

For example, of the conventional sealing/cooling devices for multi-chip modules described above, the example presented in Japanese laid-open patent publication number 3-283451 provides a cooling water jacket above a sealing top plate mounted using a thermal-conductive grease. However, the thermal conductivity of thermal-conductive grease is generally low, making reduction of thermal resistance difficult. Also, even if the cooling water jacket and the sealing top plate can be made very flat, providing a uniform thickness for the thermal-conductive grease interposed between them is very difficult due to factors such as the manner in which the two are fixed and thermal deformation caused by temperature distribution generated within these members.

Thus, variations in the thickness of the heat-conductive grease can affect the temperature of individual LSI chips.

The second issue is that with LSI chips having larger dimensions and higher heat-generating densities, providing a uniform temperature distribution within a single LSI chip is more difficult compared with conventional LSIs.

To provide uniform electrical properties in the circuit elements in high-integration LSI chips, it is important to provide a uniform temperature distribution within the LSI chip. Furthermore, minimizing thermal deformation generated due to uneven temperature distribution is also important in preventing reduced reliability in multi-chip modules.

The third issue is that as multi-chip modules become larger, productivity factors such as efficiency in assembly and disassembly become more important compared to conventional technologies.

In particular, when fixing the back surface of a semiconductor device and the sealing top plate for the multi-chip module using solder, or when sealing the multi-chip module using solder or the like, the temperature of the entire module must be increased and decreased in order to allow the solder to melt and solidify. To minimize thermal deformation generated when the temperature rises due to heating and when the temperature lowers due to cooling, it is important that both materials have the same thermal expansion coefficient and to reduce the thermal capacity of individual members.

For example, of the conventional sealing/cooling devices for multi-chip modules described above, the example presented in Japanese laid-open patent publication number Hei 2-257664 uses solder to fix the back surface of the LSI to the back surface of the integrally formed water-cooled heat sink. However, when the water-cooled heat sink is made larger in order to maintain cooling properties, the thermal capacity of the integrally formed water-cooled heat sink increases. Thus, when it is fixed to the back surface of the LSI with solder, there will be significant temperature differences within the water-cooled heat sink itself or between the water-cooled heat sink and other members. This can reduce connection reliability for the LSI as well as the reliability of the sealing provided for the multi-chip module.

The fourth issue is that as the heat generated by multi-chip modules increases, the flow rate for the cooling fluid used to cool the multi-chip module must be large. Thus, it is important to increase the strength of the cooling device as well as the pipe connections used in letting the cooling water flow in and out.

For example, of the conventional multi-chip module sealing/cooling devices described above, the example presented in Japanese laid-open patent publication number 2-257664 provides an integrally formed water-cooled heat sink formed from a ceramic multi-layer circuit substrate and a ceramic with high thermal conductivity, in which the thermal expansion coefficients are the same. This makes it difficult to increase the strength of the water-cooled heat sink and the pipe connections letting the cooling water in and out of the water-cooled heat sink.

Figure 1:
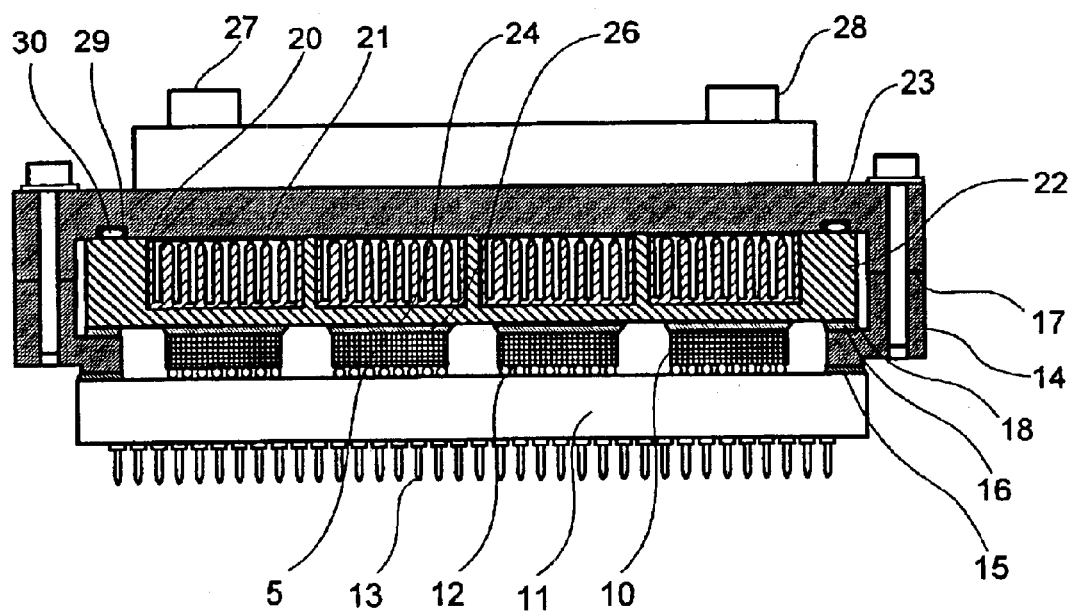
FIG. 1 illustrates a cross-section drawing of a multi-chip module sealing/cooling device showing a representative embodiment of the present invention.
Figure 2:
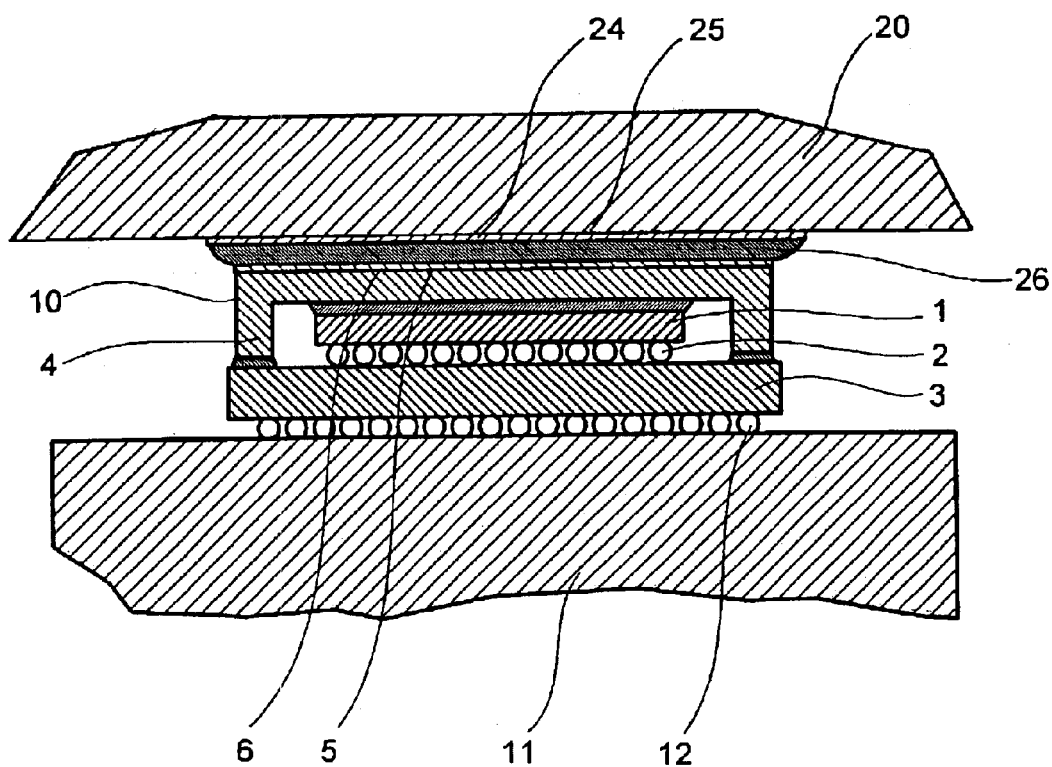
FIG. 2 illustrates a cross-section drawing showing a detailed view of the semiconductor device from FIG. 1.

The following is a description of a representative embodiment of the present invention, with references to FIG. 1 and FIG. 2.

FIG. 1 is a cross-section drawing showing the structure of a multi-chip module sealing/cooling device implementing this embodiment. FIG. 2 is a cross-section drawing showing a semiconductor device 10 from FIG. 1.

In FIG. 1, a plurality of semiconductor devices 10 are mounted on a ceramic multi-layer circuit substrate 11 via very small solder balls 12. In the semiconductor devices, as shown in detail in FIG. 2, an LSI chip 1 is mounted on a ceramic micro-substrate 3 via very small solder balls 2. The back surface of the LSI chip 1 is soldered to the inner wall of a micro-package 4. The entire LSI chip 1 is covered and sealed by the micro-package 4. Input/output pins 13 are disposed on the back surface of the multi-layer circuit substrate 11 to supply power and transfer signals to the semiconductor devices 10.

The ceramic used in the micro-substrate 3 and the multi-layer circuit substrate 11 is a material that has a thermal expansion coefficient consistent with that of the LSI chips 1, that contains low-resistance circuitry, and that has low permittivity and high-speed signal transfer properties. A glass ceramic or a mullite ceramic is preferable in specific embodiments.

A frame 14 is formed from an iron-nickel alloy having a thermal expansion coefficient consistent with that of the multi-layer circuit substrate 11. The lower surface of the frame 14 is bonded using a solder 15 to the edge of the multi-layer circuit substrate 11 on the side on which the semiconductor devices 10 are mounted. The upper section of the frame 14 extends out from the multi-layer circuit substrate 11 and comprises a flange surface 16 supporting an edge 22 of the sealing top plate 20 on which are formed multiple parallel cooling flow path grooves 21; and a flange surface 17 fixing a cooling flow path cover 23 covering the entirety of the cooling flow path grooves 21.

The sealing top plate 20 on which are formed the cooling flow path grooves 21 is made from a material having a low thermal expansion coefficient that is consistent with the thermal expansion coefficient of the ceramic multi-layer circuit substrate 11. The material also has a high thermal conductivity to allow transfer of heat generated by the semiconductor devices 10 with low thermal resistance and has strength to withstand the pressure of the cooling fluid flowing through the cooling flow path grooves 21. In particular, an aluminum nitride (AlN) with high thermal conductivity can be used in specific embodiments. Similarly, an aluminum nitride (AlN) with high thermal conductivity can be used for the micro-package 4 in specific embodiments.

Metallized layers 25, 6 are respectively formed on the facing surfaces of the back surface 24 of the sealing top plate 20, on which are formed the cooling flow path grooves 21, and on back surfaces 5 of the semiconductor devices 10. The sealing top plate 20 and the semiconductors 10 are fixed to each other through a solder bond 26 formed between the metallized layers 25, 6. The thickness of the solder bond 26 is determined by the precision used in processing and assembling the different members in the multi-chip module, but generally the thickness can be kept in the range of 0.1–0.2 mm.

Furthermore, a metallized layer (not shown in the figure) is also applied to the bottom surface of the edge 22 of the sealing top plate 20. When the semiconductor devices 10 and the sealing top plate 20 are soldered together, a solder bond 18 is also applied simultaneously between the flange surface 16 of the frame 14 and the bottom surface of the edge 22 of the sealing top plate 20, thus sealing the multi-chip module. For the solder used in the solder bond 18 and the solder bond 26, Sn37Pb (eutectic solder, 183 degrees C. melting point) would be desirable.

On the cooling flow path cover 23, cooling fluid entry/exit openings 27, 28 are formed, and an O-ring groove 29 is formed facing the edge 22 of the sealing top plate 20 to prevent the cooling fluid flowing through the cooling fluid path grooves 21 from leaking out. An O-ring 30 is inserted in the O-ring groove 29, and the cooling flow path cover 23 is fitted and bolted to the flange surface 17 of the frame 14, thus fixing the cooling fluid seal and the cooling flow path cover 23. The cooling flow path cover 23 is metallic. However, copper or stainless steel can be used if the temperature of the cooling fluid flowing through the cooling flow grooves 21 is roughly the same as that of the multi-chip module after the sealing process for the multi-chip module has been completed, i.e., the multi-chip module has cooled down. If the temperature of the cooling fluid varies greatly, it would be desirable to use an iron-nickel alloy having a thermal expansion coefficient consistent with that of the multi-layer circuit substrate 11.

With the structure described above, the heat generated by the LSI chip 1 passes through the micro-cap 4, the solder bond 26, and the sealing top plate 20, and is dissipated efficiently through the cooling fluid flowing through the cooling fluid flow path grooves 21. The thermal conductivity of solder is generally roughly 10–20 times greater than grease having high thermal conductivity.

The solder bond 26 and the solder bond 18 are melted and then solidified to fill gaps. Thus, unevenness and gap can be absorbed even if there is unevenness in the solder bond surface of the ceramic multi-layer circuit substrate 11 or the sealing top plate 20, the semiconductor devices 10 have different gap distance with respect to the sealing top plate 20, or has been mounted at an angle, or if there is unevenness in the solder bond surface between the flange 16 of the frame 14 and the edge 22 of the sealing top plate 20. Thus, embodiments of the multi-chip module can be produced relatively easily and at relatively low cost.

The metallic cooling flow path cover 23 can be separated when the semiconductor devices 10 and the sealing top plate 20 are soldered together or when the flange surface 16 of the frame 14 and the edge 22 of the sealing top plate 20 are soldered together. Thus the thermal capacity of the sealing top plate 20 can be kept low, thus reducing thermal deformation generated when the temperature increases due to heating or when the temperature decreases due to cooling. Thus, production of specific embodiments of the multi-chip module can be relatively more efficient, providing easier assembly and disassembly.

Furthermore, when the metallic cooling flow path cover 23 is fitted and bolted to the flange surface 17 of the frame 14, only the surface pressure from the O-ring 30 is applied to the ceramic sealing top plate 20. In specific embodiments, this increases the reliability of the seal provided by the ceramic sealing top plate 20. Also, since the cooling flow path cover 23 is metallic, there can be relatively greater strength in the pipe connections that allow the cooling fluid to flow in and out of the cooling flow path grooves 21.

In a specific embodiment, the semiconductor devices 10 are LSI packages containing LSI chips 1. However, in alternative embodiments, the semiconductor device 10 can be the LSI chip 1 by itself.

Figure 3:
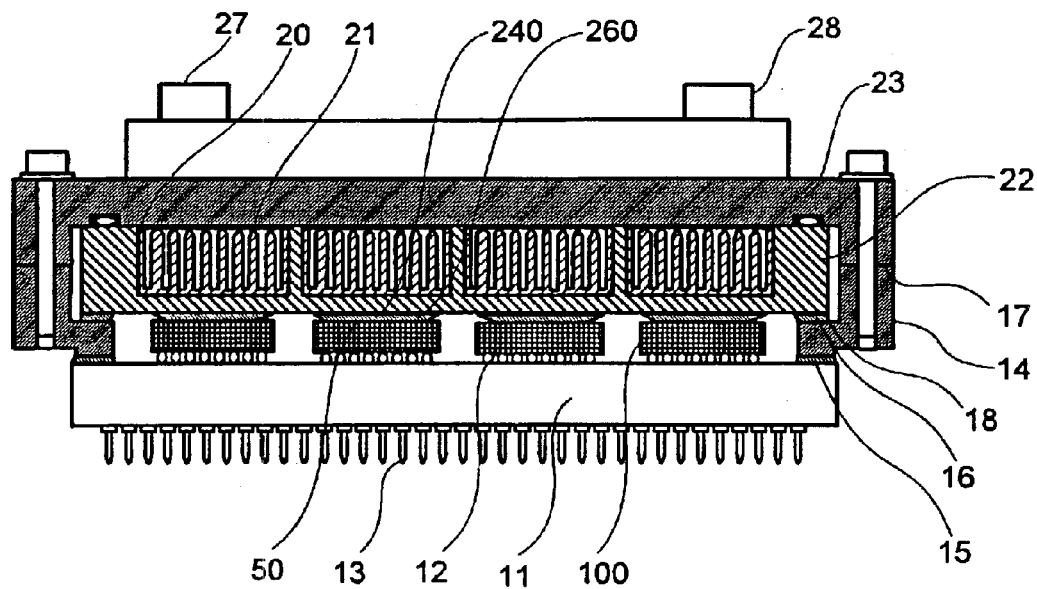
FIG. 3 illustrates a cross-section drawing of a multi-chip module sealing/cooling device showing an alternative embodiment of the present invention.
Figure 4:
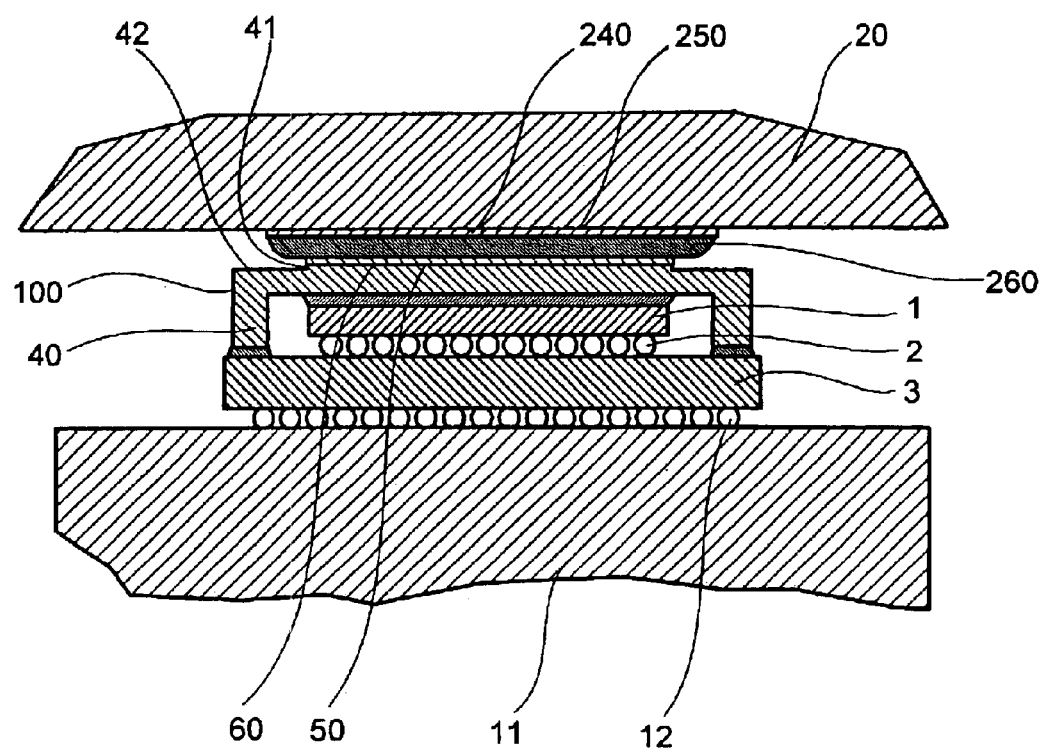
FIG. 4 illustrates a cross-section drawing showing a detailed view of the semiconductor device from FIG. 3.

The following is a description of an alternative embodiment of the present invention, with references to FIG. 3 and FIG. 4. In this embodiment, elements corresponding to those from FIG. 1 and FIG. 2 are assigned like numerals and the corresponding descriptions will be omitted. FIG. 3 is a cross-section drawing of a multi-chip module sealing/cooling device according to this embodiment. FIG. 4 is a cross-section drawing showing the details of the semiconductor device.

FIG. 4 shows details of a semiconductor device 100 from a specific embodiment. Inside the semiconductor device 100, the LSI chip 1 is mounted on the ceramic micro-substrate 3 via very small solder balls 2. The back surface of the LSI chip 1 is soldered to the inner wall surface of the micro-package 40, and the entire LSI chip 1 is covered by the micro-package 40 to seal the LSI chip 1. Furthermore, the micro-package 40 is formed with a lowered offset 41 at the edge of the back surface 50. A metallized layer 60 is disposed on the back surface 50 of the micro-package 40 excluding a shelf surface 42 formed by the offset 41. A back surface 240 of the sealing top plate 20 on which are formed cooling flow path grooves 21 and the back surface 50 of the semiconductor device 100 are fixed together by a solder bond 260 formed between a metallized layer 250 and the metallized layer 60.

With the structure described above, the area over which solder bonding takes place with the sealing top plate 20, on which the cooling flow path grooves 21 are formed, is kept smaller than the overall area of the back surface of the micro-package 40, thus allowing a relatively uniform temperature distribution within the LSI chip 1. The reason that the temperature distribution can be uniform is as follows. When the LSI chip 1 is fixed to the micro-chip package 40, which is larger than the area of the LSI chip 1, the heat generated by the LSI chip 1 is transferred to the micro-package 40 more easily from the peripheral portion of the LSI chip 1 than the center portion of the LSI chip 1. This allows the heat to be transferred relatively more easily to the micro-package 40 at the peripheral portions of the LSI chip 1. However, if the area of the solder bond 260 between the back surface 240 of the sealing top surface 20 and the back surface 50 of the semiconductor device 100 is reduced by the lowered offset 41 at the edge of the back surface of the micro-package 40, the heat generated by the LSI chip 1 can be transferred from the peripheral portion of the LSI chip 1 to the micro-package 40, but then it is more difficult for the heat to be transferred to the sealing top plate 20. Thus, by controlling the area of the solder bond 260, the thermal resistance from the peripheral portion of the LSI chip 1 to the sealing top plate 20 can be made approximately the same as the thermal resistance from the central section of the LSI chip 1 to the sealing top plate 20, thus preventing the temperature at the peripheral portion of the LSI chip 1 from being significantly lower than the temperature of the central section. As a result, the temperature distribution within the LSI chip 1 can be made approximately uniform.

Also, with the structure described above, since the thermal deformation generated by uneven temperature distribution in the LSI chip 1 is reduced, increased reliability is provided for the connections formed from the very small solder balls 2 used to mount the LSI chip 1 and the very small solder balls 12 used to mount the semiconductor device 10 on the ceramic multi-layer circuit substrate 11. This prevents the deterioration of reliability in the multi-chip module. The area of the solder bond 260 that allows a approximately uniform temperature distribution in the LSI chip 1 is approximately the same as or less than the area of the LSI chip 1.

In specific representative embodiments according to the present invention, solder bonds are formed between the semiconductor device and the sealing top plate, but it would also be possible to use a form of high thermal conduction bonding, besides solder bonding, such as a high thermal conductive adhesive or a high thermal conductive grease.

As described above, embodiments according to the present invention can provide a multi-chip module sealing/cooling device equipped with a multi-chip module cooling mechanism that can uniformly and efficiently lower the temperature of an LSI with high integration, high heat generation density, large dimensions, high power dissipation, and dense mounting.

Also, embodiments according to the present invention can provide a multi-chip module sealing/cooling device equipped with a multi-chip module sealing module protecting the LSI described above with long-term reliability and with easy assembly and disassembly.

The preceding has been a description of the preferred embodiment of the invention. It will be appreciated that deviations and modifications can be made without departing from the scope of the invention, which is defined by the appended claims.

What is claimed is:

1. A method for sealing multi-chip modules, said multi-chip modules comprising a circuit substrate having a plurality of semiconductor devices mounted thereon, and a frame, said frame fixed to said circuit substrate and formed from a material having a thermal expansion coefficient consistent with a thermal expansion coefficient of said circuit substrate, said method comprising:

forming onto a first surface of a sealing top plate a cooling flow path having openings through which cooling fluid may flow;

bonding a second surface of said sealing top plate to a back surface of said semiconductor devices;

joining an edge of said sealing plate to said frame to form a first seal;

covering said cooling flow path with a cooling flow path cover;

interposing a sealing material between said edge of said sealing top plate and said cooling flow path cover to form a second seal; and tightening together said cooling flow path cover, said sealing material, said sealing top plate and said frame.

2. A method for sealing multi-chip modules as described in claim 1 wherein:

said bonding a second surface of said sealing top plate to a back surface of said semiconductor devices further comprises:

soldering said back surface of said semiconductor devices to said second surface of said sealing top plate.

3. A method for sealing multi-chip modules as described in claim 1 wherein:

said sealing top plate is formed from an aluminum nitride ceramic having high thermal conductivity; and said cooling flow path cover is metallic.

4. A method for sealing multi-chip modules as described in claim 1 further comprising:

forming an offset on said back surface of said semiconductor device; and soldering a higher surface of said offset to said sealing top plate.

5. A method for sealing multi-chip modules as described in claim 4 wherein said offset is at substantially 500 micrometers measured from said back surface of said semiconductor device.

6. A method for sealing multi-chip modules as described in claim 1 wherein said semiconductor devices comprise micro-packages containing LSI chips.

7. A method for sealing multi-chip modules as described in claim 1 wherein said tightening further comprises tightening at least one of a plurality of bolts.

8. A method for sealing multi-chip modules as described in claim 1 wherein said sealing material comprises an o-ring.

9. A method for sealing multi-chip modules as described in claim 1 wherein said first seal comprises a butt-joint.

10. A method for sealing multi-chip modules as described in claim 1 further comprising injecting nitrogen gas into an air tight area formed by said second surface of said sealing top plate, said frame, a first surface of said circuit substrate, and said first seal.

* * * * *